United States Patent [19]

Shimada

[11] Patent Number: 4,878,221
[45] Date of Patent: Oct. 31, 1989

[54] ERROR-CORRECTING DECODER FOR RAPIDLY DEALING WITH BUFFER OVERFLOW

[75] Inventor: Michio Shimada, Tokyo, Japan
[73] Assignee: NEC Corporation, Tokyo, Japan
[21] Appl. No.: 138,273
[22] Filed: Dec. 28, 1987

[30] Foreign Application Priority Data

Dec. 25, 1986 [JP]  Japan .................................. 61-310331

[51] Int. Cl.$^4$ .............................................. G06F 11/10
[52] U.S. Cl. .......................................... 371/43; 371/46
[58] Field of Search .......................... 371/43, 44, 45, 46

[56] References Cited

U.S. PATENT DOCUMENTS

| | | | |
|---|---|---|---|
| 4,291,406 | 9/1981 | Bahl et al. ............................ | 371/44 |
| 4,293,951 | 10/1981 | Rhodes .................................. | 371/43 |
| 4,404,674 | 9/1983 | Rhodes .................................. | 371/43 |
| 4,539,684 | 9/1985 | Kloker .................................. | 371/46 |
| 4,583,078 | 4/1986 | Shenoy et al. ........................ | 371/43 |

Primary Examiner—Charles E. Atkinson
Attorney, Agent, or Firm—Sughrue, Mion, Zinn, Macpeak & Seas

[57] ABSTRACT

For use in decoding received code symbols corresponding to original code symbols consisting of original information symbols and original redundancy symbols and comprising a sequential decode controller (45) responsive to the received code symbols for producing a sequence of presumed information symbols corresponding to the respective original information symbols, an encoder replica (46, 47) responsive to the presumed information symbols for producing presumed code symbols consisting of the presumed information symbols and presumed redundancy symbols corresponding to the respective original redundancy symbols, and a likelihood calculator (48) for calculating likelihoods which the presumed code symbols have relative to the respective received code symbols, a decoder comprises a position counter (61) for counting position counts for the respective presumed information symbols in the sequence and a modifier (81) for giving a predetermined value, such as zero, to the likelihoods calculated for the respective presumed redundancy symbols until the position counts reach a predetermined count after initialization of the position counter. The position counter is initialized on dealing with buffer overflow of at least one buffer used in the decoder, such as a buffer (41, 43) for the received code symbols. Preferably, the predetermined count is equal to the number of presumed information symbols held at a time in the encoder replica for use in producing each presumed redundancy symbol.

6 Claims, 4 Drawing Sheets

ERROR-CORRECTING DECODER FOR RAPIDLY DEALING WITH BUFFER OVERFLOW

BACKGROUND OF THE INVENTION:

This invention relates to an error-correcting decoder for use as a counterpart of an error-correction encoder.

In the manner which will later be described more in detail, an error-correction encoder is for use in encoding a sequence of original information symbols into a sequence of original code symbols. For this purpose, a sequence of original redundancy symbols is produced from the original information symbol sequence in accordance with a predetermined rule and added to the original information symbol sequence to produce the original code symbol sequence. Each redundancy symbol may consist of only one bit, in which event it is often the case to refer to the redundancy symbol as a redundancy bit. The original code symbol sequence is whichever of a bit-series and a bit-parallel sequence and is either transmitted to a transmission channel or route or stored in a storage medium.

Either transmitted through the transmission channel or reproduced from the storage medium, the original code symbol sequence is supplied to a counterpart error-correcting decoder as an input sequence of received code symbols. When compared with the original code symbol sequence, the input sequence generally includes errors here and there mainly due to noise in the transmission channel or to physical defects of the storage medium. Regardless of presence and absence of the errors, it is possible to understand that the received code symbols are in correspondence to the respective original code symbols. The decoder is for producing a reproduction of the original information symbol sequence with the errors automatically corrected.

Such an error-correcting decoder is preferably a sequential error-correcting decoder. In the sequential error-correcting decoder, a sequential decode controller executes a sequential decoding algorithm on the input sequence to produce a local sequence of presumed or judged information symbols which are presumed for the respective original information symbols. An encoder replica is operable like the encoder and encodes the local sequence into a replica output sequence of presumed code symbols. To this end, the encoder replica produces a sequence of presumed redundancy symbols in response to the local sequence in accordance with the predetermined rule. When used together, the presumed information symbol sequence and the presumed redundancy symbol sequence provide the presumed code symbol sequence. Responsive to the input and the replica output sequences, a likelihood calculator calculates likelihoods which the presumed code symbols have relative to the respective received code symbols. The likelihood calculator thereby produces a likelihood signal which represents the likelihoods.

The likelihood signal is fed back to the sequential decode controller and is used in executing the sequential decoding algorithm. In this manner, the sequential decoding algorithm is executed according to a trial and error scheme to automatically correct the errors and thereby to make the encoder replica produce the presumed information symbol sequence as the reproduction of the original information symbol sequence. In order to carry out the trial and error scheme, at least one buffer is used in the decoder in the manner described in U.S. patent application Ser. No. 099,801 filed Sept. 22, 1987, by the present applicant (EPC patent application No. 87 1137 78.2 filed Sept.21, 1987) with reference to the drawing figures of that patent application. Inasmuch as the buffers have a limited capacity, buffer overflow is inevitable.

It is to be noted that the encoder internal state which is variable from time to time. The encoder replica has a replica internal state which varies in synchronism with the encoder internal state in a steady state of operation of the decoder. When the buffer overflow takes place, the replica internal state becomes out of synchronism with the encoder internal state. This makes it impossible for the decoder to produce the reproduction of the original information symbol sequence. It is therefore very desirable to deal with the buffer overflow to rapidly recover the steady state of operation.

Various methods of dealing with the buffer overflow are already known. Typically, the methods are the "guess-and-restart" technique and the blocked data technique described in a book jointly written by George C. Clark, Jr., and J. Bibb Cain under the title of "Error-Correction Coding for Digital Communications" and first published 1981 by Plenum Press, New York and London, particularly from page 316 to page 318 of the book.

According to the guess-and-restart technique, the input sequence is read into the buffer with a predetermined length omitted when the buffer overflow takes place. With a space thereby formed in the buffer, the replica internal state is initialized by using hard decisions of the received code symbols as the presumed code symbols. This may or may not put the replica internal state into synchronism with the encoder internal state. If the synchronism is not achieved by once initializing the replica internal state, the replica internal state must repeatedly be initialized with a space again formed in the buffer. When the transmission channel is used, the synchronism would have to be again and again initialized upon occurrence of burst errors. Even when the storage medium is used, it will take a long time to reach the steady state of operation of the decoder.

According to the blocked data technique, the original information symbol sequence is block in the encoder into an intermittent succession of blocks with a unique word interposed between each pair of successive blocks. In the decoder, the input sequence is read into the buffer with a predetermined number of blocks omitted when the buffer overflow takes plane. The replica internal state is initialized so as to be coincident with the unique word. This may shorten the time necessary for achieving the synchronism. Use of the unique words, however, reduces an amount of information which is either transmitted or stored. Moreover, block synchronism must be established between the encoder and the decoder. This is very difficult in a truck transmission channel. It is necessary on the other hand in the present-day information-intensive social system, into which electronic digital computers and electrical and optical communication system are merged, to deal with a great amount of information at a high speed with the information protected against any errors and without the block synchronism.

SUMMARY OF THE INVENTION:

It is therefore an object of the present invention to provide a sequential error-correcting decoder capable of rapidly dealing with buffer overflow.

It is another object of this invention to provide a sequential error-correcting decoder of the type described, which comprises a position counter initialized in a novel manner on dealing with the buffer overflow.

Other objects of this invention will become clear as the description proceeds.

On describing the gist of this invention, it is possible to define that an error-correcting decoder is for use as a counterpart of an error-correction encoder for encoding a sequence of original information symbols into a sequence of original code symbols by production of original redundancy symbols in accordance with a predetermined rule and by addition of the redundancy symbols to the respective information symbols to form the respective code symbols, and includes a sequential decode controller for executing a sequential decoding algorithm on an input sequence of received code symbols corresponding to the respective original code symbols to produce a local sequence of presumed information symbols presumed for the respective original information symbols, an encoder replica for encoding the local sequence into a replica output sequence of presumed code symbols by production of presumed redundancy symbols in accordance with the predetermined rule and by addition of the presumed redundancy symbols to the respective presumed information symbols to form the respective presumed code symbols, and a likelihood calculator responsive to the input and the replica output sequences for calculating likelihoods which the presumed code symbols have relative to the respective received code symbols, which likelihood calculator is for thereby producing a likelihood signal representative of the likelihoods.

In accordance with this invention, the above-defined error-correcting decoder is characterized by: (A) a position counter coupled to the sequential decode controller for counting position counts for the respective presumed information symbols in the local sequence to produce a count signal representative of the position counts; (B) modifying means responsive to the count signal for modifying a likelihood signal into a modified signal by giving a predetermined value to the likelihoods calculated for the respective presumed redundancy symbols until the position counts reach a predetermined count; and (C) supplying means for supplying the modified signal to the sequential decode controller to make the modified signal control execution of the sequential decoding algorithm.

Figure 1:
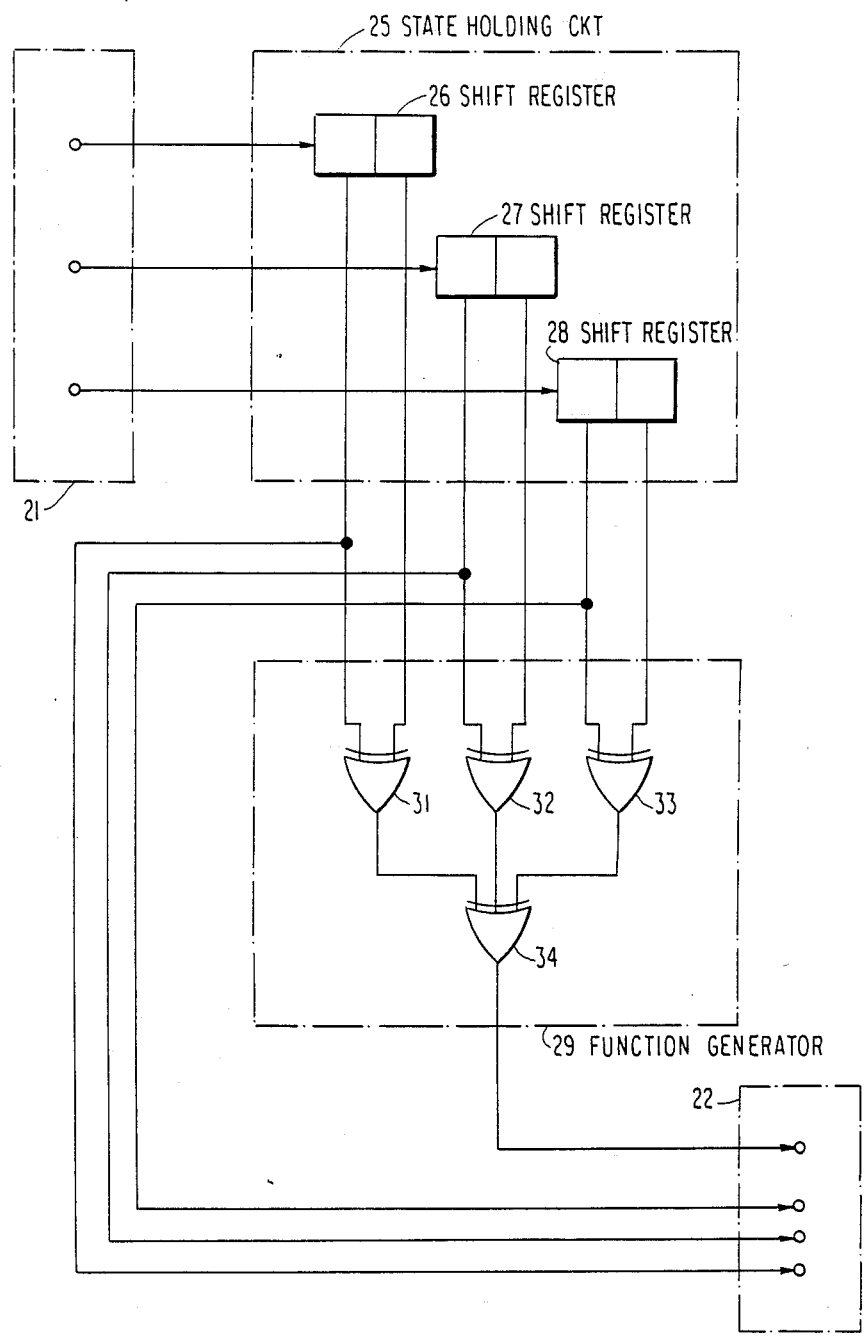
FIG. 1 shows a specific example of error-correction encoders in blocks for use in facilitating an understanding of the instant invention.

DESCRIPTION OF THE PREFERRED EMBODIMENTS:

Referring to FIG. 1, a specific example of error-correction encoders will be described at first in order to facilitate an understanding of the present invention. Such an error-correction encoder will briefly be referred to as an encoder insofar as no inconvenience arises.

In FIG. 1, the encoder has encoder input and output terminals 21 and 22. The encoder output terminal 22 is for connection to either a transmission channel or route or to a storage medium (not shown). It will be assumed for a short while merely for brevity of description that the output terminal 22 is connected to a transmission channel.

The encoder input terminal 21 is supplied with a sequence of original information symbols representative of information or data which should be transmitted to the transmission channel through the encoder output terminal 22 together with a sequence of original redundancy symbols as a sequence of original code symbols. The original information symbol sequence is supplied to the input terminal 21 by segmenting an information bit sequence representative of the information.

For the specific example, each original information symbol consists of first through third bits. Each original redundancy symbol consist of a single bit and is an original redundancy bit. Each original code symbol consists of first through fourth bits. The encoder deals with the original information symbol sequence and the original code symbol sequence in bit parallel. In the manner which will be described later in the description, each original redundancy symbol may consist of a plurality of bits. In this event, the encoder deals with the original redundancy symbol sequence also in bit parallel.

An encoder state holding circuit 25 is successively supplied with the original information symbols from the encoder input terminal 21. For the specific example, the state holding circuit 25 is implemented by first through third parallel shift registers 26, 27, and 28 which are depicted in a staggered manner merely for convenience of illustration and are supplied with the first through the third bits of each original information symbol at a time. In the example being illustrated, each shift register has first and second stages from a left end to a right end of that shift register. The first stages of the respective shift registers 26 through 28 are supplied with each original information symbol as a fresh information symbol.

Inasmuch as each shift register has two stages, two original information symbols are held in the encoder state holding circuit 25 at each instant of time and are shifted through the respective shift registers 26 to 28 rightwardly of the figure in the manner known in the art. In this manner, the encoder state holding circuit 25 has an encoder internal state which in renewed whenever the state holding circuit 25 is supplied with each fresh information symbol.

The first stages of the respective shift registers 26 to 28 supply the fresh information symbol to the encoder output terminal 22. It will be said that the encoder state holding circuit 25 has an information symbol holding length of two symbols because the state holding circuit 25 holds two information symbols at each time instant to specify the encoder internal state.

An encoder function generator 29 is coupled to the encoder state holding circuit 25 in a predetermined manner which will presently be exemplified. Responsive to the encoder internal state which state which the state holding circuit 25 has at each time instant, the function generator 29 delivers one of the original redundancy symbols to the encoder output terminal 22 concurrently with delivery of each fresh information symbol from the state holding circuit 25 to the output terminal 22.

In FIG. 1, the encoder function generator 29 comprises first through third two-input Exclusive OR circuits 31, 32, and 33 and a single three-input Exclusive OR circuit 34. The first circuit 31 is supplied with two first bits held at a time in the first shift register 26 for two consecutive original information symbols. Similarly, the second circuit 32 is supplied with two second bits from the second shift register 27 and the third circuit 33, with two third bits from the third shift register 28. The first through the third circuits 31 to 33 produce first through third input bits. Responsive to the first through the third output bits, the single circuit 34 delivers an odd parity bit to the encoder output terminal 22 as each original redundancy symbol or bit.

It is now understood that the encoder encodes the original information symbol sequence into the original code symbol sequence by producing the original redundancy symbol sequence in accordance with a predetermined rule and by adding the redundancy symbol sequence to the information symbol sequence. For a different rule, the encoder function generator 29 may have a different structure and/or may differently be coupled to the encoder state holding circuit 25. In addition, the encoder internal state may be defined by a different information symbol holding length.

Figure 2:
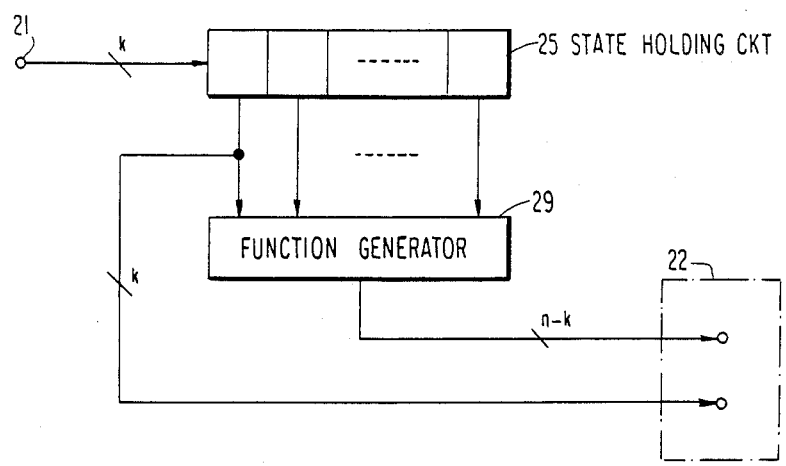
FIG. 2 shows a block diagram of a more general example of the error-correction encoders for a similar use.

Turning to FIG. 2, a more general example of the encoders comprises similar parts which are designated by like reference numerals and are operable with likewise named signals. In the more general example, the encoder is for original information symbols of a common bit length or common information symbol length of k bits and for original code symbols of a common bit length or common code symbol length of n bits. The original redundancy symbols have a common bit length or common redundancy symbol length of (n-k) bits.

The encoder state holding circuit 25 has an information symbol holding length of K symbols. It should be noted in this connection that the letter K has no direct concern with the other letter k. The state holding circuit 25 is preferably implemented by first through k-the parallel shift registers, each having first through K-the stages. The first stages of the first through the k-the shift registers are collectively depicted by a left end rectangular block of the state holding circuit 25. At any rate, the state holding circuit 25 has an encoder internal state which is renewed whenever the state holding circuit 25 is supplied with each original information symbol from the encoder input terminal 21 as a fresh information symbol.

The encoder function generator 29 is coupled to the encoder state holding circuit 25 in a predetermined manner. Responsive to the encoder internal state, the function generator 29 produces the original redundancy symbol sequence in accordance with a predetermined rule. It will readily be understood that the encoder of FIG. 2 is operable in the manner described with reference to FIG. 1.

Reviewing FIGS. 1 and 2, it may be mentioned here that various codes are already known for use in error-correction encoding in the manner described in the above-referenced book of Clark, Jr., and Cain, particularly on pages 227 through 231 of the book. By way of example, the code may be a tree code, such as a convulutional code or a trellis code. It is possible to use the predetermined rule in providing each original code symbol by any one of such known codes.

Figure 3:
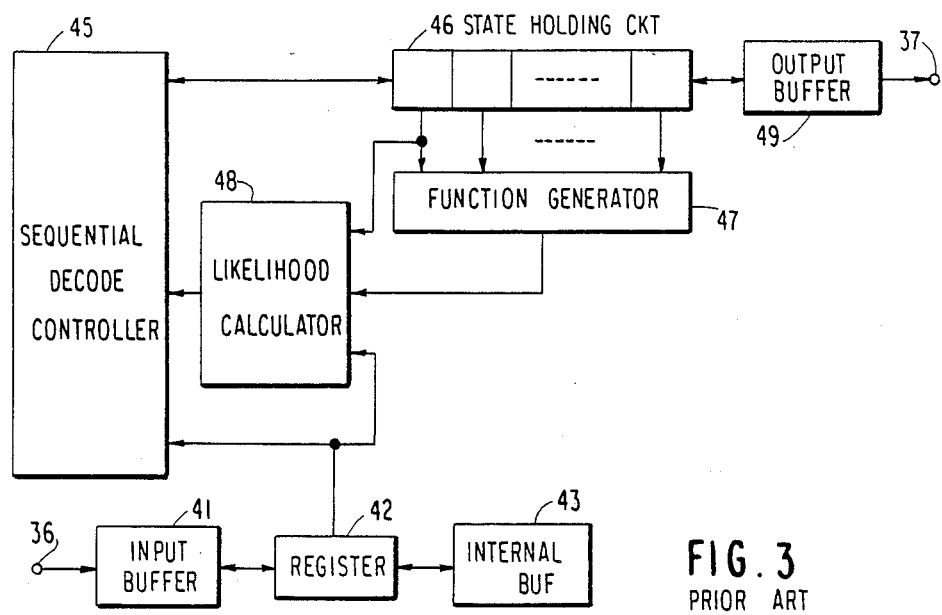
FIG. 3 is a block diagram of a conventional error-correcting decoder.

Further turning to FIG. 3, a conventional error-correcting decoder will be described. Like the error-correction encoder, such an error-correcting decoder will simply be called a decoder. It will be assumed that the conventional decoder is for use as a counterpart of the encoder illustrated with reference to FIG. 2. More particularly, the decoder is for use in combination with the encoder which encodes a k-bit original information symbol sequence into a n-bit original code symbol sequence. For this purpose, the encoder produces an (n-k)-bit original redundancy symbol sequence in accordance with a predetermined rule which is exemplified in conjunction with FIG. 1 and is mentioned with reference to the book jointly written by Clark, Jr., and Cain. The redundancy symbol sequence is added to the information symbol sequence to provide the code symbol sequence.

The decoder has decoder input and output terminals 36 and 37. Either transmitted through a transmission channel or once stored in a storage medium and then reproduced therefrom, the original code symbol sequence is delivered to the decoder input terminal 36 as a decoder input sequence of received code symbols having a common bit length or common code symbol length of n bits. The decoder input sequence is therefore an n-bit received code symbol sequence. When compared with the original code symbol sequence, the decoder input sequence has errors here and there mainly due to either noise in the transmission channel or physical defects of the storage medium. Regardless of presence and absence of such an error, it is possible to understand that the received code symbols are in correspondence to the respective original code symbols.

In practice, the decoder is not directly supplied with the decoder input sequence but with an analog reception signal. An analog-to-digital converter (not shown) is therefore used in converting the analog reception signal to the decoder input sequence for delivery to the decoder input terminal 36. In any event, the decoder input sequence is delivered from the input terminal 36 to an input buffer 41 which is for use in accumulating the received code symbols.

Responsive to a forward move signal which will later be described, each received code symbol is moved rightwardly of the figure from the input buffer 41 to a register 42 which temporarily memorizes the received code symbol as a fresh code symbol. In this manner, a previous code symbol is further rightwardly moved from the register 42 to an internal buffer 43 when another fresh code symbol is stored in the register 42 from the input buffer 41. Such previous code symbols are accumulated in the internal buffer 43 as internal code symbols.

Responsive to a backward move signal which will later be described like the forward move signal, each received code symbol is moved from the register 42 leftwardly of the figure back to the input buffer 41. At this moment, each internal code symbol is leftwardly moved from the internal buffer 43 to the register 42 as a fresh code symbol.

In the manner which will become clear as the description proceeds, a sequential decode controller 45 executes a sequential decoding algorithm on a controller input sequence of received code symbols which are supplied successively from the register 42 primarily while the received code symbols are rightwardly moved from the input buffer 41 to the internal buffer 43. Responsive to each received code symbol of the controller input sequence, the sequential decode controller 45 produces a presumed information symbol which is presumed or judged as the original information symbol included in the received code symbol under consideration. The sequential decode controller 45 thereby produces a local sequence of such presumed information symbols. In the example being illustrated, the presumed information symbols have a common information symbol length of k bits.

A decoder state holding circuit 46 is similar in structure to the encoder state holding circuit 25 described in conjunction with FIG. 2 and receives the local sequence from the sequential decode controller 45. As a consequence, the state holding circuit 46 has a local internal state which is renewed whenever the state holding circuit 46 is supplied with each presumed information symbol as a fresh information symbol.

It is to be noted that the decoder state holding circuit 46 should be capable of reversedly renewing the local internal state when the received code symbols are successively supplied from the register 42 while leftwardly moved from the register 42 back to the input buffer 41 and from the internal buffer 43 back to the register 42. Each shift register should therefore be a bidirectional shift register when the state holding circuit 46 is implemented by parallel shift registers in the manner described in connection with FIG. 2. At any rate, the state holding circuit 46 produces a circuit output sequence of such fresh information symbols.

The sequential decode controller 45 supplies either the forward move signal or the backward move signal to a bus which will later be partly illustrated. Besides rightwardly moving the received code symbols from the input buffer 41 to the register 42 and from the register 42 to the internal buffer 43, the forward move signal is used in forwardly renewing the local internal state, as by moving the presumed information symbols through the decoder state holding circuit 46 rightwardly of the figure. Likewise, the backward move signal is used in reversedly of backwardly renewing the local internal state.

A decoder function generator 47 has a structure which is identical with that of the encoder function generator 29 described in connection with FIG. 2 and is coupled to the decoder state holding circuit 46 in the manner in which the encoder function generator 29 is coupled to the encoder state holding circuit 25. Whenever the local internal state is either forwardly or backwardly renewed, the function generator 47 produces a presumed redundancy symbol corresponding to the original redundancy symbol which is included in the fresh information symbol used to renew the local internal state. In this manner, the function generator 49 produces a generator output sequence of such presumed redundancy symbols which have a common redundancy symbol length of (n-k) bits.

It is now understood that a combination of the decoder state holding circuit 46 and function generator 47 serves as an encoder replica which is operable like the encoder illustrated with reference to FIG. 2. More specifically, the encoder replica is for encoding the local sequence into a replica output sequence of presumed code symbols by producing the presumed redundancy symbols in accordance with the predetermined rule used in the encoder in question and by adding the presumed redundancy symbols to the presumed information symbols. The replica output sequence therefore consists of the circuit output sequence and the generator output sequence and is an n-bit sequence. The local internal state may now be called a replica internal state.

A likelihood calculator 48 is supplied with the replica output sequence from the encoder replica and successively with the received code symbols from the register 42 and calculates a likelihood representative of a degree to which each presumed code symbol of n bits in similar to one of the received code symbols of the common code symbol length of n bits in the manner which will presently be described. The likelihood calculator 48 thereby produces a likelihood signal representative of the likelihoods which the presumed code symbols have relative to the respective received code symbols. In the conventional decoder, the likelihood signal is delivered directly to the sequential decode controller 45 to control execution of the sequential decoding algorithm as will be shortly become clear.

Supplying the local internal state to the decoder function generator 47 and the circuit output sequence to the likelihood calculator 48, the decoder state holding circuit 46 successively produces the presumed information symbols of the local sequence from a right and thereof as circuit output symbols while the received code symbols are rightwardly moved from the input buffer 41 to the internal buffer 43 through the register 42. In the manner known in the art, the circuit output symbols are accumulated in an output buffer 49 as buffered symbols which are sequentially delivered from the output buffer 49 to the decoder output terminal 37 as a decoder output sequence. During a steady state of operation of the decoder during which the received code symbols are steadily rightwardly moved, a reproduction of the original information symbol sequence is given by the output sequence in which the errors, if any, are automatically corrected.

In the above-cited book jointly written by Clark, Jr., and Cain, particularly on pages 267 through 328 of the book, various sequential decoding algorithms are described. For example, the sequential decode controller 45 may use an algorithm which is known as the Fano algorithm in the art and will be exemplified in the following. The Fano algoriths is described in detail in an article contributed by Robert M. Fano to IEEE Transactions on Information Theory, Volume IT-9, April 1963, pages 64 through 74, under the title of "A Heuristic Discussion of Probabilistic Decoding."

The Fano algorithm will now be described in connection with a case wherein the original information symbols have a common information symbol length of two bits. In this case, each information symbol is one of four possible or allowable symbols 00, 01, 10, and 11. When individually supplied with the four possible symbols in each received code symbol delivered from the register 42, the encoder replica produces various replica output symbols in the replica output sequence in correspondence to the four possible symbols. The sequential decoder controller 45 compares the received code symbol cyclically or otherwise with the replaca output symbols and presumes or judges that the received code symbol in question is one of the replica output symbols that has a maximum likelihood relative to the received code symbol under consideration. In this manner, one of the four possible symbols is selected as the presumed information symbol for the received code symbol being dealt with.

In the conventional decoder being illustrated, the likelihoods are calculated separately by the likelihood calculator 48. The Fano likelihood λ, as called in the art, is widely used on comparing the likelihoods which the respective replica output symbols have relative to each received code symbol. The Fano likelihood is defined by:

$$\lambda = \log_2[p(y/x)/p(y)] - B,$$

where p(y) represents a probability that the received code symbol is a code symbol y, p(y/x) represents another probability that the received code symbol is the code symbol y when the original code symbol is another code symbol x, and B represents a parameter which is called a bias term and for which an optimum value is preliminarily decided, as by simulation. The Fano likelihood has a real value. In practice, the Fano likelihood is approximated for convenience of implementation of the sequential decode controller 45 by an integer which is approximately proportional to the real value. Moreover, the presumed information symbols are successively presumed with a maximum accumulated likelihood calculated in the sequence decode controller 45.

It is to be noted here that a great number of errors may appear in the decoder input sequence either when the transmission channel is subjected to strong noise or when the storage medium has many physical defects. In such an event, an erroneous symbol may be presumed as the presumed information symbol. Once such an erroneous presumption is carried out, the local internal state will thereafter become different from the encoder internal state. In other words, the replica internal state becomes out of synchronism with the encoder internal state. As a result, the sequential decode controller 45 becomes incapable of finding a presumed information symbol. It is therefore possible, from a difficulty in finding a presumed information symbol, to detect the fact that an erroneous presumption was done in the past. A rigorous criterion is described in the Fano article for use in deciding whether or not an erroneous symbol has ever been presumed as a presumed information symbol.

According to the Fano algorithm, the local internal state is returned to a past internal state when the sequential decode controller 45 finds it difficult to decide a replica output symbol of a great Fano likelihood. Thereafter, the sequential decode controller 45 again executes the Fano algorithm to judge, as a corrected symbol, another replica output symbol having the Fano likelihood which is next great to the Fano likelihood calculated for the erroneous symbol. The Fano algorithm is restarted from the corrected symbol.

If such a return to the past internal state has ever been done, the last-mentioned replica output symbol must have already been tested as regards the Fano likelihood. In this event, the local internal state is returned further back to a more previous internal state. The Fano likelihood is once again calculated to judge still another replica output symbol as a fresh corrected symbol. In this manner, the Fano algorithm proceeds according to a trial and error scheme.

In order to renew the local internal state successively in response to the presumed information symbols of the local sequence during the steady state of operation of the decoder and to return the local internal state either back to the past state or further back to the more previous state, the sequential decode controller 45 delivers the forward and the backward move signals to the afore-mentioned bus. Incidentally, it is likewise possible to put the sequential decode controller 45 into operation by a sequential decoding algorithm which is known as the stack algorithm in the art. Such an encoder and a conventional decoder are readily implemented in the manner disclosed by George David Forney, Jr., in U.S. Pat. No. 3,665,396.

In the manner described heretobefore, buffer overflow is inevitable in at least one of the input, the internal, and the output buffers 41, 43, and 49. Inasmuch as the buffers 41, 43, and 49 are typically various parts of a random access memory (usually abbreviated to RAM), the buffer overflow is detected by a pointer or pointers known in the art.

It is described also hereinabove in connection with the conventional decoders that recovery from the buffer overflow is possible either according to the guess-and-restart technique by initializing the local internal state by hard decisions carried out by the sequential decode controller 45 on the received code symbols or according to the blocked data technique by initializing the local internal state in coincidence with the unique words interposed in the decoder input sequence and hence also in the controller input sequence. However, these conventional techniques are not quite satisfactory.

Figure 4:
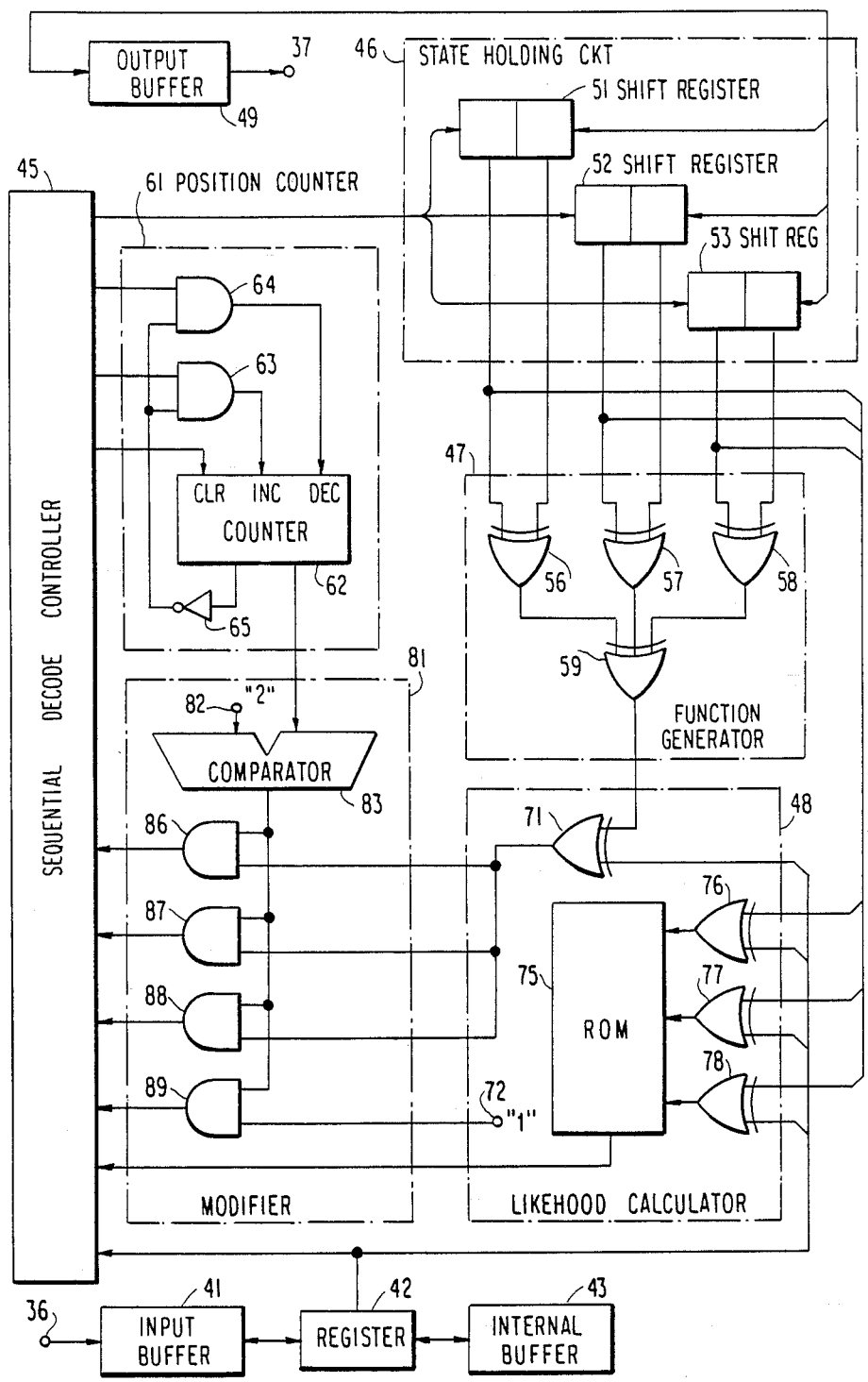
FIG. 4 is a block diagram of an error-correcting decoder according to a specific embodiment of this invention.

Referring now to FIG. 4, the description will proceed to an error-correcting sequential decoder according to a specific embodiment of this invention. The decoder comprises similar parts which are designated by like reference numerals and are operable with likewise named signals except for several novel points that will presently be described and are very important in rapidly carrying out recovery from buffer overflow based in principle on the guess-and-restart technique rather than on the blocked data technique.

It is assumed that the decoder being illustrated is for use as a counterpart of the encoder illustrated with reference to FIG. 1. That is, the decoder is for use in combination with the encoder which encodes a three-bit original information symbol sequence into a four-bit original code symbol sequence with a single-bit original redundancy symbol sequence produced in accordance with a predetermined rule exemplified in conjunction with FIG. 1 and added to the information symbol sequence. Each presumed information symbol has first through third bits corresponding to the first through the third bits of each original information symbol.

In the known manner, the decoder state holding circuit 46 is implemented by first through third parallel shift registers 51, 52, and 53. Each of the shift registers 51 through 53 is a bidirectional shift register and has first and second stages in correspondence to the shift registers 26 through 28 described in conjunction with FIG. 1. It will be said that the first stages of the respective shift registers 51 to 53 are at a first end of the state holding circuit 46 and that the second stages are at a second end of the state holding circuit 46.

When the forward move signal is produced, the first through the third bits of each presumed information symbol are supplied from the sequential decode controller 45 to the first end of the decoder state holding circuit 46 collectively as a fresh information symbol. Such presumed information symbols are forwardly shifted through the state holding circuit 46 to be delivered from the second end to the output buffer 49 as the afore-mentioned circuit output symbols. Successive fresh information symbols are delivered to the likelihood calculator 48 as the above-mentioned circuit output sequence.

When the backward move signal is produced, each buffered symbol is supplied from the output buffer 49 back to the second end of the decoder state holding circuit 46 as one of the presumed information symbols and are backwardly or reversedly shifted through the state holding circuit 46. On reaching the first end, namely to the first stages of the respective shift registers 51 through 53, each presumed information symbol becomes a "fresh" information symbol.

The decoder function generator 47 comprises first through third two-input Exclusive OR circuits 56, 57, and 58 and a single three-input Exclusive OR circuit 59. Like the encoder function generator 29 described in connection with FIG. 1, the circuits 56 through 59 are used in producing the single-bit presumed redundancy symbols of the generator output sequence in response to the replica internal state which is either forwardly renewed by the forward move signal or backwardly or reversedly renewed by the backward move signal.

On describing the novel points, those of the presumed information symbols will be called replica information symbols which are held in the encoder replica at each time instant and include each fresh information symbol. Furthermore, a sequence of the circuit output symbols will be named a replica information sequence. Inasmuch as the input and the internal buffers 41 and 43 are for the received code symbols, it is now possible to say that the decoder comprises a buffer arrangement which is for the decoder input sequence and the replica information sequence and is, in the manner described before, subject to the buffer overflow.

The decoder input sequence consists of a partial sequence of received redundancy symbols corresponding to the respective original redundancy symbols and a remaining sequence of received information symbols corresponding to the respective original information symbols. In the example being illustrated, each received code symbol has first through fourth bits, among which the first through the third bits are had by each received information symbol and are in correspondence to the first through the third bits of each presumed information symbol. The fourth bit is had by each received redundancy symbol and corresponds to a single bit of the presumed redundancy symbol. The partial and the remaining sequences are used in bit parallel. Incidentally, the circuit and the generator output sequences may alternatively be termed a fresh information symbol sequence and a presumed redundancy symbol sequence.

In FIG. 4, the sequential decode controller 45 produces an initializing signal when the buffer overflow should be dealt with. A position counter 61 is coupled to the sequential decode controller 45 to count position counts for the respective presumed information symbols in the local sequence and to produce a count signal representative of the position counts. The sequential decode controller 45 supplies the position counter 61 with the forward and the backward move signals and additionally with the initializing signal as a clear signal.

For the example being illustrated, the position counter 61 comprises a twelve-bit counter 62 having a clear input terminal CLR supplied with the clear signal, a count increasing terminal INC, and a count decreasing terminal DEC. The clear signal clears or initializes the counter 62 and therefore the position counter 61 to decimal zero. The forward move signal is supplied to a first input terminal of an increasing AND circuit 63. The backward move signal is supplied to a first input terminal of a decreasing AND circuit 64. It may be mentioned here that the twelve-bit counter 62 is counted up and down between zero and $(2^{12}-1)$. An inverter 65 is for inverting the most significant bit of a twelve-bit output binary signal of the counter 62 into an inverted bit. A second input terminal of each of the increasing and the decreasing AND circuits 63 and 64 is supplied with the inverted bit. The forward and the backward signals therefore count by and down the position counts unless the most significant bit becomes the binary one at the position count of $(2^{12}-1)$. The AND circuits 63 and 64 and the inverter 65 are therefore for preventing the position counts from returning to zero even when the forward move signal is produced for the presumed information symbols greater in number than $(2^{12}-1)$ during the steady state of operation of the decoder with no buffer overflow.

In the likelihood calculator 48, a partial calculator is supplied with the partial sequence and the presumed redundancy symbol sequence and calculates redundancy symbol likelihoods which the presumed redundancy symbols have relative to the respective received redundancy symbols. In the illustrated example, the partial calculator comprises a single Exclusive OR circuit 71 responsive to the presumed redundancy symbol sequence and the partial sequence for calculating first through third more significant bits of each redundancy symbol likelihood. In the partial calculator, a calculator input terminal 72 is supplied with a calculator input signal representative of unity to give a fourth or the least significant bit of each redundancy symbol likelihood. Each redundancy symbol likelihood is therefore given by a two's complement and is an integer which is equal to plus decimal one and minus decimal seven when the presumed redundancy symbols are and are not identical with the respective received redundancy symbols, respectively.

A remaining calculator of the likelihood calculator 48 is supplied with the remaining sequence and the fresh information symbol sequence and calculates information symbol likelihoods which the presumed information symbols have relative to the respective received information symbols. The remaining calculator thereby produces a partial signal representative of the information symbol likelihoods as a part of the likelihood signal.

More specifically, the remaining calculator comprises a read-only memory (ROM) 75 having a plurality of addresses in which the respective information symbol likelihoods are preliminarily written. The remaining sequence and the fresh information symbol sequence are collectively used as a bit-parallel address signal for accessing various addresses of the read-only memory 75 in accordance with various combinations of binary one and zero bits of the received and the fresh information symbols.

In the example being illustrated, each information symbol likelihood is represented by six bits and is given by a two's complement. The first bits of each fresh information symbol and each received information symbol are delivered to the read-only memory 75 through a first Exclusive OR circuit 76. The second bits are delivered through a second Exclusive OR circuit 77. The third bits are delivered through a third Exclusive OR circuit 78. For the respective addresses of the read-only memory 75, the information symbol likelihoods are given according to:

$$(-7) \times z + 1 \times (3-z),$$

where z represents the number of binary one bits in the three-bit address signal.

The decoder comprises a modifier 81 supplied with the count signal from the position counter 61 and the likelihood signal representative of the redundancy and the information symbol likelihoods from the likelihood calculator 48. The modifier 81 is for modifying the likelihood signal into a modified signal for delivery to the sequential decode controller 45. In the modified signal, the partial signal is untouched, namely, the information symbol likelihoods are delivered to the sequential decode controller 45 as they stand. On the other hand, the redundancy symbol likelihoods are given a predetermined value only until the position counts reach a predetermined count after initialization of the position counter 61 or the position counts.

In the illustrated example wherein the encoder replica holds two presumed information symbols at a time, the predetermined count is preferably equal to decimal two, namely, equal to a predetermined number of the replica information symbols held in the encoder replica at each time instant. The modifier 81 comprises a comparator input terminal 82 supplied with a reference signal representative of the predetermined count as a reference count. Responsive to the count signal and the reference signal, a comparator 83 compares the position counts with the reference count to produce a comparison result signal which has a logic zero and a logic one level when the position counts are equal to the reference count or less and when the position counts are greater than the reference count, respectively.

First through fourth AND circuits 86, 87, 88, and 89 are supplied with the comparison result signal in common and with the first through the fourth bits of each redundancy symbol likelihood. It is now clear that zero is given as the predetermined value to the redundancy symbol likelihoods only when the position counts are not greater than the reference count. It is possible in this manner to select zero or a minus value as the predetermined value for the redundancy symbol likelihoods which are variable between a positive and a negative integer generally when each received redundancy symbol and hence each presumed redundancy symbol has a plurality of bits.

In the sequential decode controller 45, the modified signal is used in the manner in which the likelihood signal is used in the conventional decoder. More particularly, the modified signal is used in controlling execution of the sequential decoding algorithm. Only when the predetermined value is given to the redundancy symbol likelihoods, the modified signal becomes the partial signal. In this event, the sequential decode controller 45 executes the sequential decoding algorithm in response to the partial signal alone. Incidentally, it may become necessary to initialize also the encoder replica as in the conventional decoder upon occurrence of the buffer overflow. Like in the conventional decoder, the encoder replica is initialized with the sequential decode controller 45 used to supply the encoder replica with hard decisions of the received code symbols of the decoder input sequence instead of the presumed information symbols of the local sequence.

Figure 5:
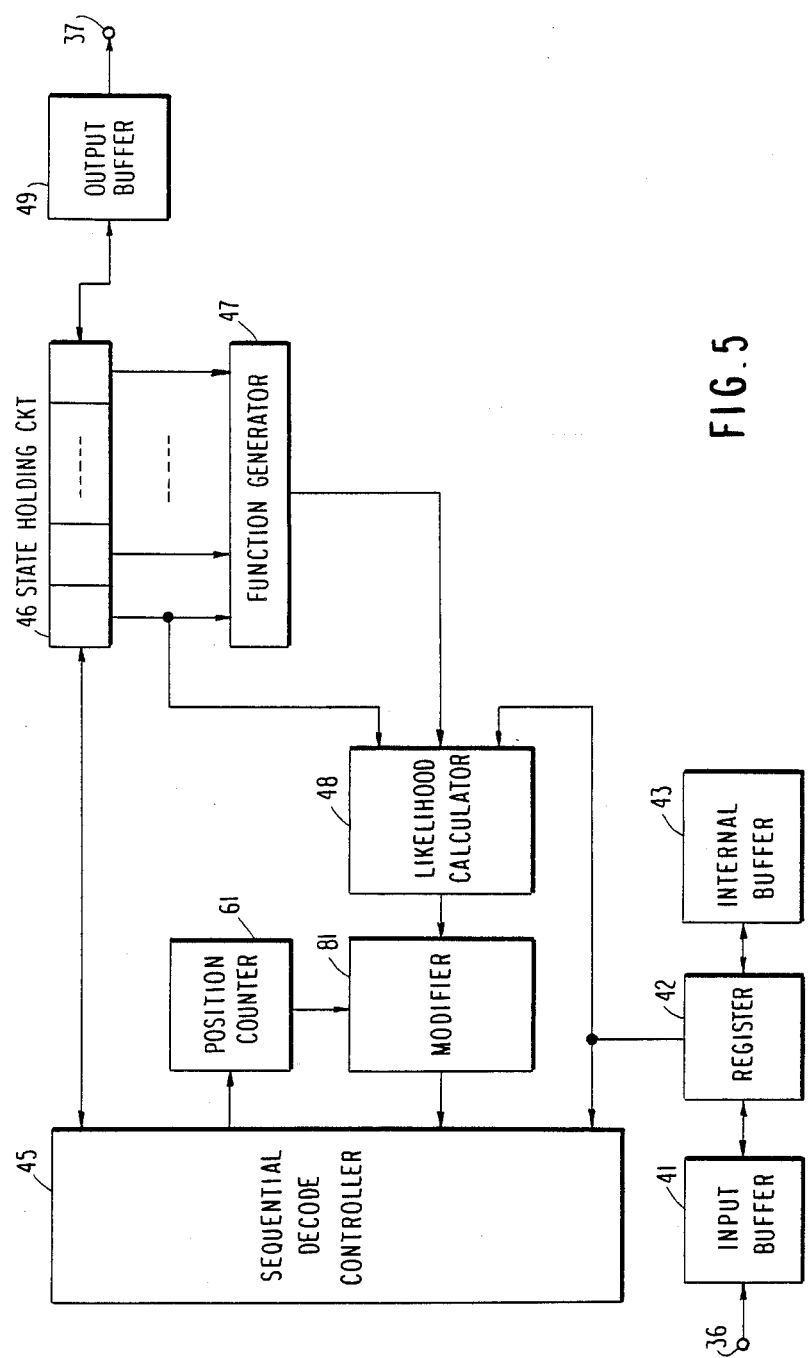
FIG. 5 is a block diagram of an error-correcting decoder according to a more general embodiment of this invention.

Referring to FIG. 5, the description will further proceed to an error-correcting sequential decoder according to a more general embodiment of this invention. The decoder comprises similar parts which are designated by like reference numerals and are operable with likewise named signals. The decoder is for use as a counterpart of the encoder illustrated with reference to FIG. 2. As regards the number of bits of each symbol, various symbol sequences are identical with those described in conjunction with FIG. 3. Except for different number of bits, other symbol sequences and other signals are used in the manner described in connection with FIG. 4. For the replica information symbols held in the decoder state holding circuit 46 of the encoder replica to define the replaca internal state at each time instant, the predetermined number is equal to K as described in relation to FIG. 2.

In the manner described with reference to FIG. 4, the likelihood calculator 48 comprises a partial calculator and a remaining calculator. The partial calculator comprises a read-only memory of the type of the memory 75 described in conjunction with FIG. 4 and is for calculating the redundancy symbol likelihoods of the type described above. The remaining calculator is for calculating the information symbol likelihoods to produce the partial signal representative of the information symbol likelihoods. The position counter 61 and the modifier 81 will readily be implemented when reference is had to the description relating to those depicted in FIG. 4.

Reviewing FIGS. 4 and 5, it should be noted that the replica internal state may incorrectly be initialized into an incorrectly initialized internal state by erroneous information symbols upon start of the sequential decoding algorithm or upon dealing with the buffer overflow. In addition, the replica internal state may become out of synchronism with the encoder internal state to become an incorrect internal state during process of the sequential decoding algorithm. Being produced in compliance with the replica internal state, the presumed redundancy symbols become incorrect redundancy symbols when the replica internal state is incorrect.

If the guess-and-restart technique is used in strict accordance with prior art, the incorrect redundancy symbols may make the sequential decode controller 45 judge each correctly presumed information symbol as an erroneous information symbol because the incorrect redundancy may unduly reduce the likelihood which must be great if the presumed redundancy symbols were correct. Alternatively, the sequential decode controller 45 may judge an erroneous information symbol as a correctly presumed information symbol when the erroneous information symbol has a great likelihood due to the incorrect redundancy symbols. In either event, it becomes necessary to repeatedly return the replica internal state either back to a past internal state or further back to a more previous internal state and to frequently deal with the buffer overflow.

According to this invention, the redundancy symbol likelihoods are given a predetermined value by the modifier 81 until the position counts of the position counter 61 reach the predetermined count, namely, until a predetermined time interval lapses, after initialization of the position counter 61. The redundancy symbol likelihoods of the predetermined value are astonishingly effective in preventing the sequential decode controller 45 from judging either a correctly presumed information symbol as an erroneous information symbol or an erroneous information symbol as a correctly presumed information symbol when the replica internal state is incorrect. As soon as the predetermined time interval lapses, the initialized internal state is swept out of the encoder replica even if the initialized internal state may be incorrect. This reduces the probability that the buffer overflow takes place again and again. As a result, the buffer overflow is unexpectedly rapidly dealt with in marked contrast to the guess-and-restart technique carried out without the improvements in the error-correcting sequential decoder which have so far been described.

What is claimed is:

1. An error-correcting decoder for use as a counterpart of an error-correction encoder for encoding a sequence of original information symbols into a sequence of original code symbols by production of original redundancy symbols in accordance with a predetermined rule and by addition of said redundancy symbols to the respective information symbols to form the respective code symbols, said decoder including a sequential decode controller for executing a sequential decoding algorithm on an input sequence of received code symbols corresponding to the respective original code symbols to produce a local sequence of presumed information symbols, an encoder replica for encoding said local sequence into a replica output sequence of presumed code symbols by production of presumed redundancy symbols in accordance with said predetermined rule and by addition of said presumed redundancy symbols to the respective presumed information symbols to form the respective presumed code symbols, and a likelihood calculator responsive to said input and said replica output sequences for calculating likelihoods which said presumed code symbols have relative to the respective received code symbols, said likelihood calculator thereby producing a likelihood signal representative of said likelihoods, wherein the improvement comprises:

a position counter coupled to said sequential decode controller for counting position counts for the respective presumed information symbols in said local sequence to produce a count signal representative of said position counts;

modifying means responsive to said count signal for modifying said likelihood signal into a modified signal by giving a predetermined value to the likelihoods calculated for the respective presumed redundancy symbols until said position counts reach a predetermined count after initialization of said position counter; and supplying means for supplying said modified signal to said sequential decode controller to make said modified signal control execution of said sequential decoding algorithm.

2. A decoder as claimed in claim 1, said encoder replica holding a predetermined number of the presumed information symbols of said local sequence at each time instant as replica information symbols and for successively producing said replica information symbols as a replica information sequence, said decoder further including buffer means for buffering said input sequence and said replica information sequence and being subject to buffer overflow, said buffer means being connected to said sequential decode controller to inform said sequential decode controller of said buffer overflow, wherein said sequential decode controller produces an initializing signal for initializing said position counter on dealing with said buffer overflow.

3. A decoder as claimed in claim 2, wherein said predetermined count is equal to said predetermined number.

4. A decoder as claimed in claim 3, the likelihoods calculated for the respective presumed redundancy symbols being variable between a positive and a negative integer, wherein said predetermined value is not greater than zero.

5. A decoder as claimed in claim 1, said encoder replica producing said presumed redundancy symbols as a presumed redundancy symbol sequence in said replica output sequence, said input sequence including a partial sequence of received redundancy symbols corresponding to the respective original redundancy symbols, wherein:

said likelihood calculator comprises a partial calculator responsive to said partial sequence and said presumed redundancy symbol sequence for calculating redundancy symbol likelihoods which the presumed redundancy symbols of said presumed redundancy symbol sequence have relative to the respective received redundancy symbols;

said modifying means giving said predetermined value to said redundancy symbol likelihoods until the position counts reach said predetermined count after initialization of said position counter.

6. A decoder as claimed in claim 5, said encoder replica producing the presumed information symbols of said local sequence as fresh information symbols one at a time and for successively producing said fresh information symbols as a fresh information symbol sequence in said replica output sequence, said input sequence including a remaining sequence of received information symbols corresponding to the respective original information symbols, wherein:

said likelihood calculator comprises a remaining calculator responsive to said remaining sequence and said fresh information symbol sequence for calculating information symbol likelihoods which said fresh information symbols have relative to the respective received information symbols, said remaining calculator thereby producing a partial signal representative of said information symbol likelihoods as a part of said likelihood signal;

said sequential decode controller executing said sequential decoding algorithm in response to said partial signal alone while said predetermined value is given to said redundancy symbol likelihoods.

* * * * *

UNITED STATES PATENT AND TRADEMARK OFFICE
CERTIFICATE OF CORRECTION

PATENT NO. : 4,878,221

DATED : October 31, 1989

INVENTOR(S) : MICHIO SHIMADA

It is certified that error appears in the above-identified patent and that said Letters Patent is hereby corrected as shown below:

Column 2, line 49, delete "plane" and insert --place--;

Column 13, line 30, delete "comprises" and insert --compares--;

Column 14, line 36, delete "process" and insert --progress--.

Signed and Sealed this

Sixth Day of November, 1990

Attest:

HARRY F. MANBECK, JR.

*Attesting Officer*  *Commissioner of Patents and Trademarks*